(12) United States Patent
Tsai et al.

(10) Patent No.: US 10,460,995 B2
(45) Date of Patent: Oct. 29, 2019

(54) METHOD OF MANUFACTURE OF A FINFET DEVICE

(71) Applicant: Taiwan Semiconductor Manufacturing Company, Ltd., Hsinchu (TW)

(72) Inventors: Chia-Ching Tsai, Tainan (TW); Yi-Wei Chiu, Kaohsiung (TW); Li-Te Hsu, Shanhua Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/783,188

(22) Filed: Oct. 13, 2017

(65) Prior Publication Data

US 2018/0151442 A1 May 31, 2018

Related U.S. Application Data

(60) Provisional application No. 62/427,560, filed on Nov. 29, 2016.

(51) Int. Cl.
*H01L 21/82* (2006.01)
*H01L 21/8234* (2006.01)
(Continued)

(52) U.S. Cl.
CPC ........ *H01L 21/823456* (2013.01); *H01L 21/02321* (2013.01); *H01L 21/31053* (2013.01); *H01L 21/31155* (2013.01); *H01L 21/32133* (2013.01); *H01L 21/76264* (2013.01); *H01L 21/823431* (2013.01); *H01L 27/0207* (2013.01); *H01L 29/42376* (2013.01); *H01L 29/6656* (2013.01); *H01L 29/66545* (2013.01); *H01L 29/785* (2013.01); *H01L 21/3065* (2013.01);
(Continued)

(58) Field of Classification Search
CPC ............... H01L 29/66545; H01L 29/42376
See application file for complete search history.

(56) References Cited

U.S. PATENT DOCUMENTS

| 8,487,378 B2 | 7/2013 | Goto et al. |
| 8,729,634 B2 | 5/2014 | Shen et al. |

(Continued)

FOREIGN PATENT DOCUMENTS

| KR | 1020150061607 A | 6/2015 |
| KR | 1020150107578 A | 9/2015 |
| KR | 1020160038673 A | 4/2016 |

OTHER PUBLICATIONS

Liu, et al., U.S. Appl. No. 15/441,063, entitled "Process for Making Multi-Gate Transistors and Resulting Structures," filed Feb. 23, 2017.

*Primary Examiner* — Kyoung Lee
*Assistant Examiner* — Christina A Sylvia
(74) *Attorney, Agent, or Firm* — Slater Matsil, LLP

(57) ABSTRACT

A semiconductor device and method of manufacture are provided in which an the physical characteristics of a dielectric material are modified in order to provide additional benefits to surrounding structures during further processing. The modification may be performed by implanting ions into the dielectric material to form a modified region. Once the ions have been implanted, further processing relies upon the modified structure of the modified region instead of the original structure.

20 Claims, 12 Drawing Sheets

(51) Int. Cl.
| | |
|---|---|
| *H01L 21/3105* | (2006.01) |
| *H01L 21/3115* | (2006.01) |
| *H01L 21/3213* | (2006.01) |
| *H01L 27/02* | (2006.01) |
| *H01L 29/423* | (2006.01) |
| *H01L 29/66* | (2006.01) |
| *H01L 21/02* | (2006.01) |
| *H01L 29/78* | (2006.01) |
| *H01L 21/762* | (2006.01) |
| *H01L 21/3065* | (2006.01) |
| *H01L 21/308* | (2006.01) |
| *H01L 21/311* | (2006.01) |

(52) U.S. Cl.
CPC ..... *H01L 21/3086* (2013.01); *H01L 21/31111* (2013.01); *H01L 21/76224* (2013.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 9,245,883 B1 | 1/2016 | Lin et al. |
| 9,461,044 B1* | 10/2016 | Chang ................. H01L 27/0886 |
| 9,548,366 B1* | 1/2017 | Ho ....................... H01L 29/6656 |
| 9,653,581 B2 | 5/2017 | Lu et al. |
| 9,698,242 B2 | 7/2017 | Yang et al. |
| 2008/0157220 A1* | 7/2008 | Joo ................... H01L 21/28518 257/384 |
| 2013/0309856 A1* | 11/2013 | Jagannathan ......... H01L 21/845 438/587 |
| 2014/0282326 A1 | 9/2014 | Chen et al. |
| 2015/0179528 A1* | 6/2015 | Wei ......................... H01L 29/49 438/595 |
| 2016/0049399 A1 | 2/2016 | Park et al. |

* cited by examiner

METHOD OF MANUFACTURE OF A FINFET DEVICE

PRIORITY CLAIM AND CROSS-REFERENCE

This application claims the benefit of U.S. Provisional Application No. 62/427,560, filed on Nov. 29, 2016, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
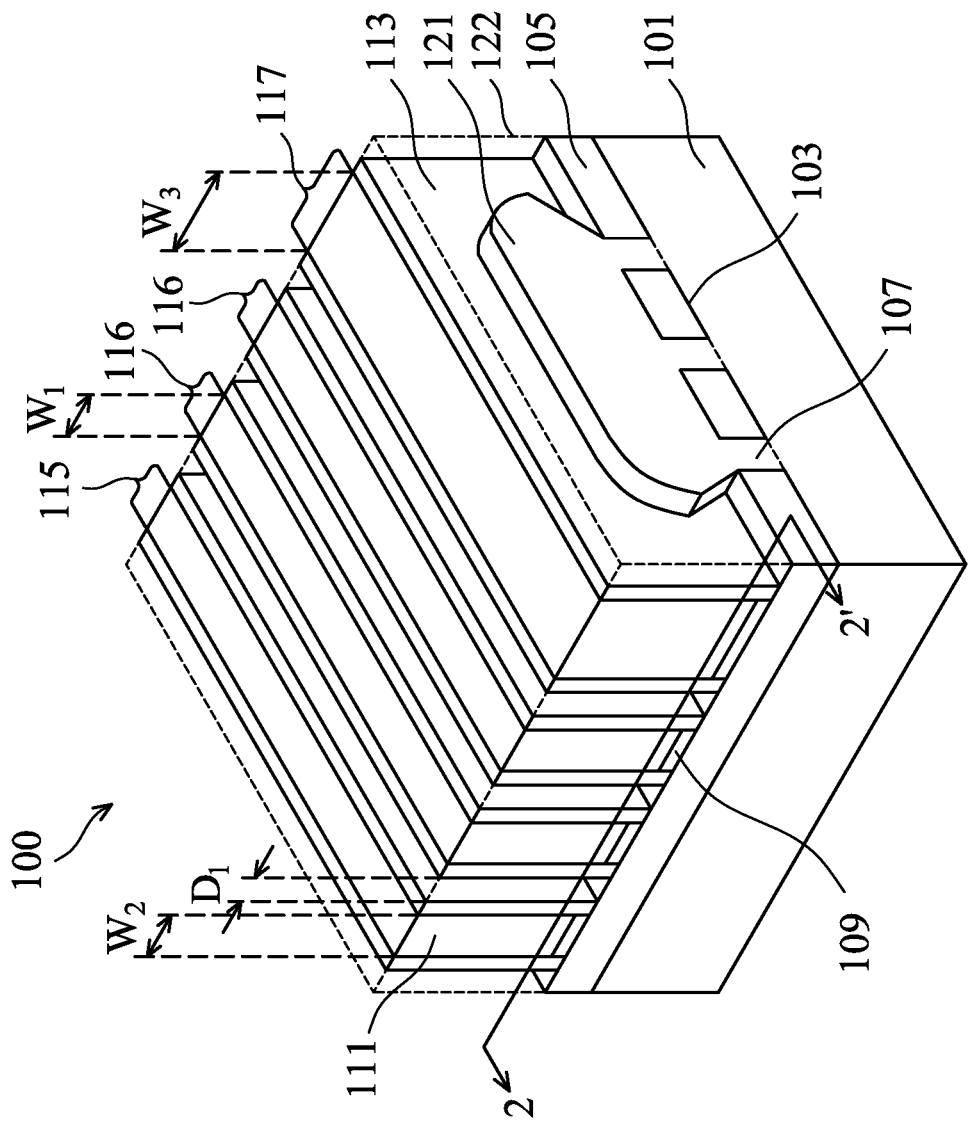
FIG. 1 illustrates a formation of gate stacks over fins in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111.

Once formed, the dummy gate dielectric 109 and the dummy gate electrode 111 may be patterned to form one or more dummy stacks 116, a short channel dummy gate stack 115, and a long channel dummy gate stack 117. In an embodiment the one or more dummy stacks 116 may be utilized to help prevent undesired variation in a region between active devices, such as by preventing dishing or other problems that arise during manufacture. In an embodiment the one or more dummy stacks 116 may be formed to have a first width $W_1$ of between about 10 nm and about 50 nm, such as about 35 nm. However, any suitable width may be utilized.

Additionally, the short channel dummy gate stack 115 will be utilized in order to help form a gate stack for a short channel transistor 607 (not illustrated in FIG. 1 but illustrated and described further below with respect to FIG. 6). For example, in some embodiments the short channel transistor may be desired to have a channel length of between about 10 nm and about 50 nm, such as less than or equal to about 40 nm. As such, in this embodiment the short channel dummy gate stack 115 may have a second width $W_2$ of between about 10 nm and about 50 nm, such as less than or equal to about 10 nm, although any suitable width may be utilized.

Finally, the long channel dummy gate stack 117 will be utilized in order to help form a gate stack for a long channel transistor 609 (not illustrated in FIG. 1 but illustrated and described further below with respect to FIG. 6). For example, in some embodiments the long channel transistor may be desired to have a channel length of between about 10 nm and about 50 nm, such as greater than about 10 nm. As such, in this embodiment the long channel dummy gate stack 117 may have a third width $W_3$ of between about 50 nm and about 150 nm, such as greater than about 100 nm, although any suitable width may be utilized.

The short channel dummy gate stacks 115 and the long channel dummy gate stacks 117 define multiple channel regions located on each side of the fins 107 beneath their individual dummy gate dielectrics 109. The short channel dummy gate stacks 115 and the long channel dummy gate stacks 117 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned short channel dummy gate stacks 115 and the patterned long channel dummy gate stacks 117.

Once the short channel dummy gate stacks 115 and the long channel dummy gate stacks 117 (along with the dummy stacks 116) have been patterned, the first spacers 113 may be formed. The first spacers 113 may be formed on opposing sides of the short channel dummy gate stacks 115, the dummy stacks 116, and the long channel dummy gate stacks 117. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one of the short channel dummy gate stacks 115, the dummy stacks 116, and the long channel dummy gate stacks 117 may be separated from a first spacer 113 adjacent to another one of the short channel dummy gate stacks 115, the dummy stacks 116, and the long channel dummy gate stacks 117 by a first distance $D_1$ of between about 10 nm and about 50 nm, such as about 35 nm. However, any suitable thicknesses and distances may be utilized.

FIG. 1 also illustrates a removal of the fins 107 from those areas not protected by the short channel dummy gate stacks 115, the dummy stacks 116, the long channel dummy gate stacks 117, and the first spacers 113 and a regrowth of source/drain regions 121. The removal of the fins 107 from those areas not protected may be performed by a reactive ion etch (RIE) using the short channel dummy gate stacks 115, the dummy stacks 116, the long channel dummy gate stacks 117, and the first spacers 113 as hardmasks, or by any other suitable removal process. The removal may be continued until the fins 107 are either planar with (as illustrated) or below the surface of the first isolation regions 105.

In another embodiment the process of removing the fins 107 may be continued to also remove those portions of the first isolation regions 105 located between the fins 107. As such, by removing those portions of the first isolation regions 105 located between the fins 107, the substrate 101 is exposed below the fins 107, allowing for a full regrowth of the source/drain regions 121 as described below.

Once these portions of the fins 107 have been removed, a hard mask (not separately illustrated), is placed and patterned to cover the dummy gate electrode 111 to prevent growth and the source/drain regions 121 may be regrown in contact with each of the fins 107. In an embodiment the source/drain regions 121 may be regrown and, in some embodiments the source/drain regions 121 may be regrown to form a stressor that will impart a stress to the channel regions of the fins 107 located underneath the short channel dummy gate stacks 115, the dummy stacks 116, and the long channel dummy gate stacks 117. In an embodiment wherein the fins 107 comprise silicon and the FinFET is a p-type device, the source/drain regions 121 may be regrown through a selective epitaxial process with a material, such as silicon or else a material such as silicon germanium that has a different lattice constant than the channel regions. In other embodiments the source/drain regions 121 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 121 may be formed to have a thickness of between about 5 Å and about 1000 Å, and may have a height above the upper surface of the first isolation regions 105 of between about 5 nm and about 250 nm, such as about 100 nm. However, any suitable height may be utilized.

Once the source/drain regions 121 are formed, dopants may be implanted into the source/drain regions 121 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the short channel dummy gate stacks 115, the dummy stacks 116, the long channel dummy gate stacks 117, and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 121 is removed. In an embodiment the hard mask may be removed using, e.g., a wet or dry etching process that is selective to the material of the hard mask. However, any suitable removal process may be utilized.

FIG. 1 also illustrates a formation of an inter-layer dielectric (ILD) layer 122 (illustrated in dashed lines in FIG. 1 in order to more clearly illustrate the underlying structures) over the short channel dummy gate stacks 115, the dummy stacks 116, the long channel dummy gate stacks 117, the first spacers 113 and the source/drain regions 121. In an embodiment the formation of the ILD layer 122 may be started by initially forming a liner layer 123 (not separately illustrated in FIG. 1 for clarity but illustrated in FIG. 2) over the underlying structure. The liner layer 123 may be a dielectric material such as TiN or TiAlC, and may be deposited using a deposition process such as chemical vapor deposition (CVD), physical vapor deposition (PVD), atomic layer deposition (ALD), or the like. The liner layer 123 may be deposited to a thickness of between about 5 nm and about 10 nm, such as about 5 nm, although any suitable thickness may be utilized.

The ILD layer 122 may comprise a material such as silicon dioxide, boron phosphorous silicate glass (BPSG), although any suitable dielectrics may be used. The ILD layer 122 may be formed using a process such as PECVD, although other processes, such as LPCVD, may alternatively be used. The ILD layer 122 may be formed to a thickness of between about 100 Å and about 3,000 Å. Once formed, the ILD layer 122 may be planarized with the first spacers 113 using, e.g., a planarization process such as chemical mechanical polishing process, although any suitable process may be utilized.

Figure 2:
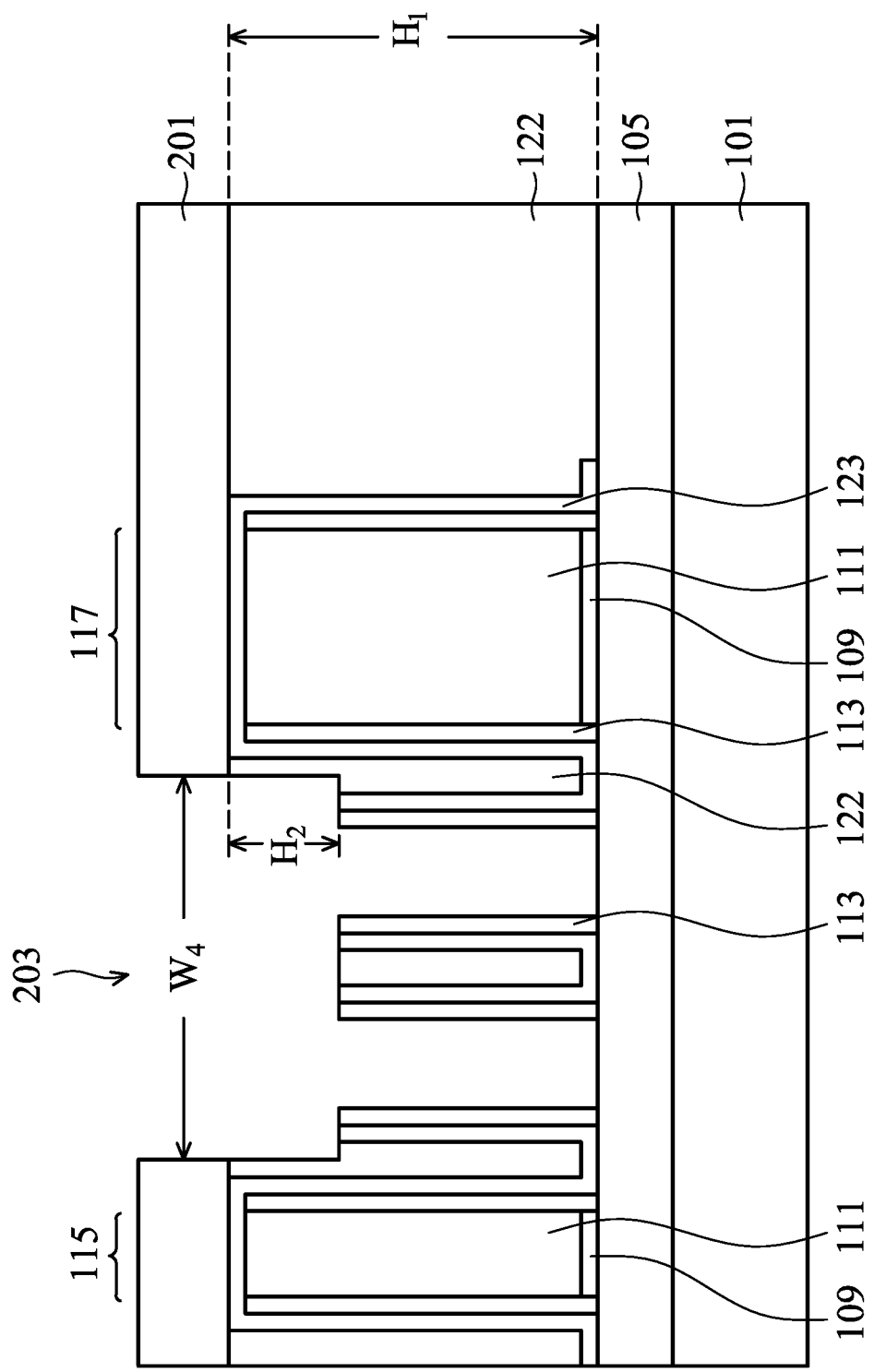
FIG. 2 illustrates a removal of gate stacks in accordance with some embodiments.

FIG. 2 illustrates a placement and patterning of a first hardmask 201 as well as a removal of the dummy gate electrode 111 and the dummy gate dielectric 109 from the dummy stacks 116, with FIG. 2 being a cross-sectional view of the structure of FIG. 1 along line 2-2'. In an embodiment the first hardmask 201 may be a dielectric material such as silicon nitride deposited using a deposition process such as CVD, PVD, or ALD to a thickness of between about 5 nm and about 10 nm, such as about 10 nm. However, any suitable material, process, and thickness may be utilized.

Once the first hardmask 201 has been deposited, the first hardmask 201 may be patterned using, e.g., a photolithographic masking and etching process. In an embodiment a photosensitive material such as a photoresist is placed over the first hardmask 201 and then exposed to a patterned energy source (e.g., light) in order to induce a chemical reaction in that portion of the photosensitive material impacted by the energy. After the chemical reaction has modified the physical properties of the exposed portion of the photosensitive material, a developer may be applied to separate the exposed portion of the photosensitive material from the unexposed portion of the photosensitive material.

Once the photosensitive material has been patterned, the pattern may be transferred to the first hardmask 201 using, e.g., an anisotropic etching process. In an embodiment the anisotropic etching process may be, for example, a reactive ion etch that etches the portions of the first hardmask 201 exposed by the photosensitive material.

In an embodiment the first hardmask 201 is patterned in order to expose the dummy stacks 116 while protecting the short channel dummy gate stack 115 and also protecting the long channel dummy gate stack 117. Once the dummy stacks 116 have been exposed, the material of the dummy stacks 116 (e.g., the dummy gate electrode 111) may then be removed using, e.g., an isotropic or anisotropic etching process to form first openings 203. For example, a reactive ion etch or wet etch with etchants that are selective to the material of the dummy gate electrode 111 may be used to remove the material of the dummy gate electrode 111.

However, in addition to simply removing the material of the dummy gate electrode 111, in some embodiments the removal of the dummy gate electrode 111 will also remove the material of the first spacers 113, the liner layer 123, and the ILD layer 122 in those portions that are exposed by the first hardmask 201. However, because the etchants being used are more selective to the dummy gate electrode 111, the materials of the first spacers 113, the liner layer 123, and the ILD layer 122 are not entirely removed, but are, instead, recessed in those portions that are exposed by the first hardmask 201.

In a particular embodiment in which the ILD layer 122 has a first height $H_1$ of between about 80 nm and about 100 nm, such as about 90 nm, at this point in the manufacturing process, the materials of the first spacers 113, the liner layer 123, and the ILD layer 122 are recessed such that the recess has a second height $H_2$ of between about 50 nm and about 70 nm, such as about 60 nm. Additionally, the first opening 203 may be formed to have a fourth width $W_4$ of between about 150 nm and about 170 nm, such as about 160 nm. However, any suitable dimensions may be utilized.

Figure 3A:
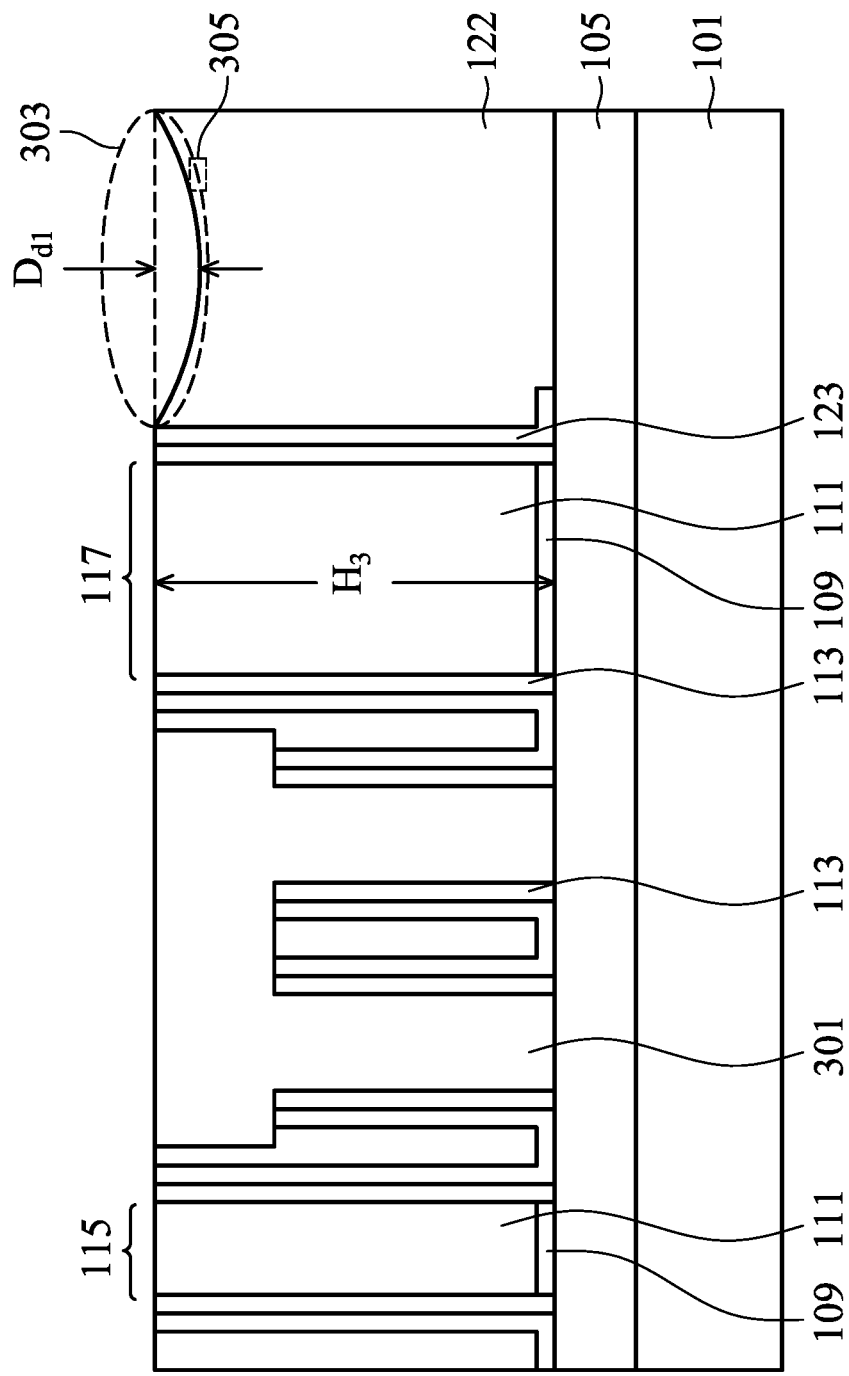
FIGS. 3A-3B illustrate a deposition of dielectric material in accordance with some embodiments.
Figure 3B:
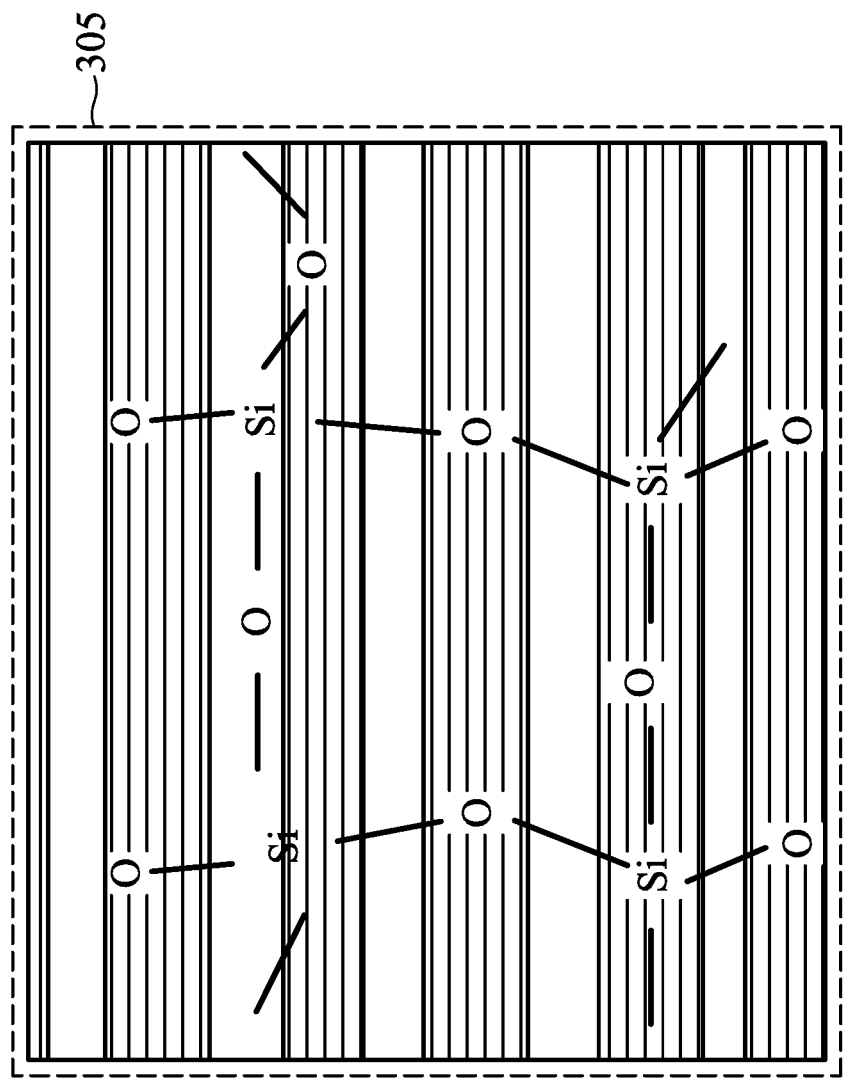

FIGS. 3A-3B illustrate a refilling of the first opening 203 left by the removal of the dummy gate electrode 111 from the dummy stacks 116 with a dielectric material 301. In an embodiment the dielectric material 301 may be deposited to fill and overfill the first opening 203 and to also extend over the first hardmask 201 (not illustrated in FIG. 3A). The dielectric material 301 may be a material such as silicon nitride and may be deposited using a deposition process such as CVD, PVD, ALD, combinations of these, or the like. However, any suitable material and placement process may be utilized.

Once the dielectric material 301 has been placed to fill and/or overfill the first opening 203, the dielectric material 301 is then planarized to remove any excess material that is located outside of the first opening 203. In an embodiment a planarization process such as a chemical mechanical polish, one or more planarizing etching process, combinations of these, or the like may be used to planarize the dielectric material 301 and remove the dielectric material 301 from outside of the first opening 203 formed by the removal of the dummy gate electrode 111 from the dummy stacks 116.

Additionally, the planarization process may be used to remove the first hardmask 201. In an embodiment the first hardmask 201 may be removed using the planarization process (e.g., a CMP) by simply continuing the planarization process once the first hardmask 201 has been exposed, and then continuing the planarization process until the first hardmask 201 has been removed. However, any suitable process may be utilized to remove the first hardmask 201.

Further, the planarization process may also be utilized to expose the dummy gate electrode 111 in both the short channel dummy gate stack 115 and the long channel dummy gate stack 117. In an embodiment the dummy gate electrode 111 in both the short channel dummy gate stack 115 and the long channel dummy gate stack 117 are exposed by continuing the planarization process to remove not only the first hardmask 201 from over the dummy gate electrode 111 in both the short channel dummy gate stack 115 and the long channel dummy gate stack 117 but to also remove the liner layer 123 from over the dummy gate electrode 111 in both the short channel dummy gate stack 115 and the long channel dummy gate stack 117. As such, the liner layer 123, the first spacers 113, and at least a portion of the ILD layer 122 are planar with each other.

As such, at the end of the planarization process, the dummy gate electrode 111 (along with the dummy gate dielectric 109), the first spacers 113, and the dielectric material 301 may all be planar with each other. Additionally, each of these may have a third height $H_3$ of between about 80 nm and about 100 nm, such as about 90 nm. However, any suitable height may be utilized.

However, by using the planarization process to planarize all of these layers, the ILD layer 122 in some regions where features are not spaced closely together will experience dishing (highlighted in FIG. 3A by the dashed circle labeled 303). This dishing occurs from a combination of factors during the planarization process (e.g., a CMP) including the structural strength of surrounding features, the selectivity of the etchants used within the CMP slurry, the material of the ILD layer 122, and the like. This dishing can cause additional problems during subsequent processing, such as the formation of gate electrodes (discussed further below with respect to 6). In an embodiment the material of the ILD layer 122 may experience a first dishing depth $D_{d1}$ of less than about 25% of the height of the ILD layer 122, such as by being between about 50 Å and about 70 Å, such as about 63 Å.

Additionally, FIG. 3B illustrates a close-up, although not to scale, representation of the material of the ILD layer 122 in dashed box 305 adjacent to the top surface of the ILD layer 122 which has experienced the dishing. In an embodiment in which the ILD layer 122 is silicon oxide, the material of the ILD layer 122 comprises a lattice of silicon atoms bonded with oxygen atoms. However, in other embodiments, the ILD layer 122 will have a lattice of different atoms depending upon the material chosen for the ILD layer 122.

Figure 4A:
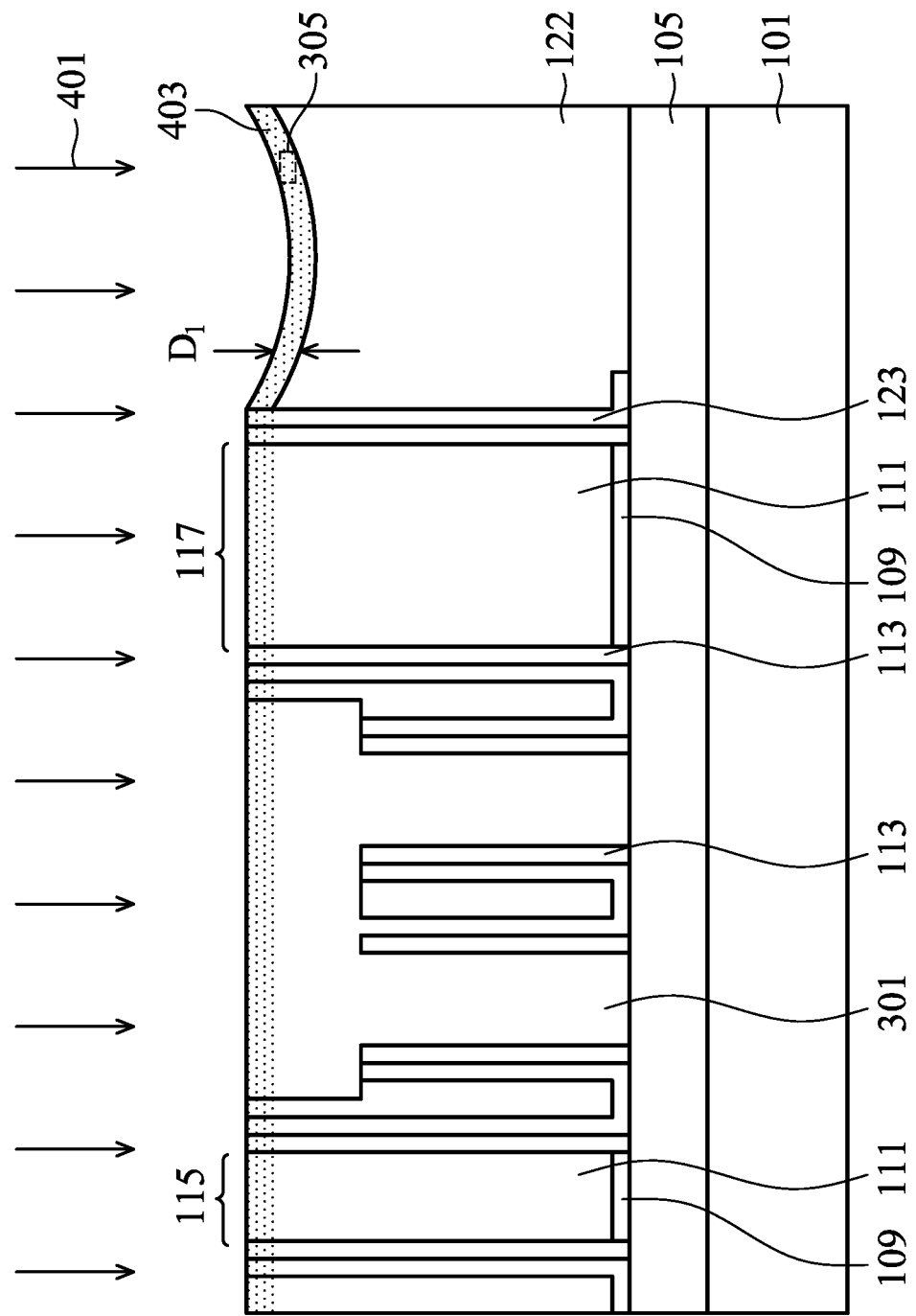
FIGS. 4A-4B illustrate an implantation process in accordance with some embodiments.
Figure 4B:
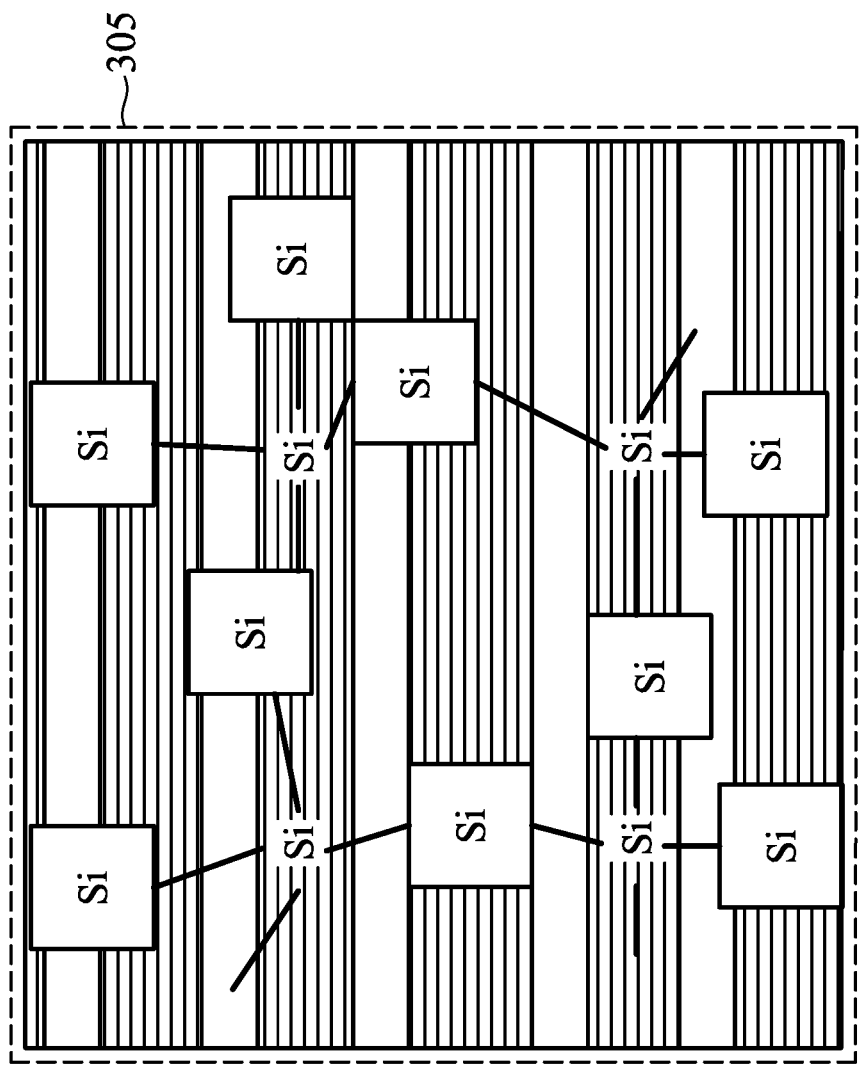

FIGS. 4A-4B illustrate a first implantation process (represented in FIG. 4A by the arrows labeled 401) that may be used to help prevent additional issues from arising during subsequent processing. In an embodiment the first implantation process 401 is performed in order to implant first dopants into the ILD layer 122. In an embodiment the first dopants may be implanted into the ILD layer 122 in order to modify the chemical structure of the ILD layer 122 and buttress the structural strength and/or etching selectivity of at least the top surface of the ILD layer 122. In an embodiment the first dopants may be any suitable dopants that can help modify and buttress the structural support or etching selectivity of the material of the ILD layer 122. For example, the first dopants may comprise one or more of the tetra-dentate ligands in Group IV, such as carbon, silicon, germanium, tin and lead, which may be used in order to form planar four-coordination complexes within the ILD layer 122. However, any suitable dopants or combination of dopants may be utilized.

In an embodiment the first dopants may be implanted into the ILD layer 122 using the first implantation process 401, whereby ions of the desired first dopants are accelerated and directed towards the ILD layer 122 in order to form a first implantation region 403. The first implantation process 401 may utilize an accelerator system to accelerate ions of the desired first dopant at a first dosage concentration. As such, while the precise dosage concentration utilized will depend at least in part on the ILD layer 122 and the species used, in one embodiment the accelerator system may utilize a dosage concentration of from about $1.0 \times 10^{16}$ atoms/cm$^2$ to about $2.0 \times 10^{16}$ atoms/cm$^2$. Additionally, the first dopants may be implanted perpendicular to the ILD layer 122 or else at, e.g., an angle of between about 20° and about 30°, such as about 25°, from perpendicular to the ILD layer 122.

By implanting the first dopants into the ILD layer 122, the material of the ILD layer 122 may be modified to increase the structural integrity and/or etching selectivity of at least a portion of the ILD layer 122. In an embodiment the first dopants may be implanted within the ILD layer 122 to a concentration of between about $1.0 \times 10^{16}$ atoms/cm$^2$ and about $2.0 \times 10^{16}$ atoms/cm$^2$, such as about $1.5 \times 10^{16}$ atoms/cm$^2$. However any suitable concentration may be utilized. The first implantation region 403 within the ILD layer 122 may have an implantation depth $D_i$ of between about 3 Å and about 5 Å, although any suitable depth may be utilized.

Additionally, instead of simply implanting into the ILD layer 122, the first implantation process 401 will implant the first dopants directly into the rest of the materials that are not covered. For example, the first implantation process 401 will also implant the first dopants into the dummy gate electrode 111 of the short channel dummy gate stack 115 as well as the long channel dummy gate stack 117, and will also implant the first dopants into the liner layer 123, the first spacers 113, and the dielectric material 301 and form the first implantation region 403 with the implantation depth $D_i$.

FIG. 4B illustrates the same close-up view of the portion of the material of the ILD layer 122 illustrated in FIG. 3B, but in which the first dopants have been implanted using the first implantation process 401. In the embodiment in which the material of the ILD layer 122 is silicon dioxide and the first dopants are silicon, the first dopants will replace some of, if not most, the oxygen atoms within the silicon dioxide, and will work to replace the lattice of the silicon dioxide with a lattice of silicon, thereby forming a Si—X rich layer, wherein "X" is the first dopant. By replacing the silicon dioxide with silicon, the structural integrity and/or etching selectivity of the material along a top surface of the ILD layer 122 may be increased in order to help adjacent structures during further processing.

Figure 5:
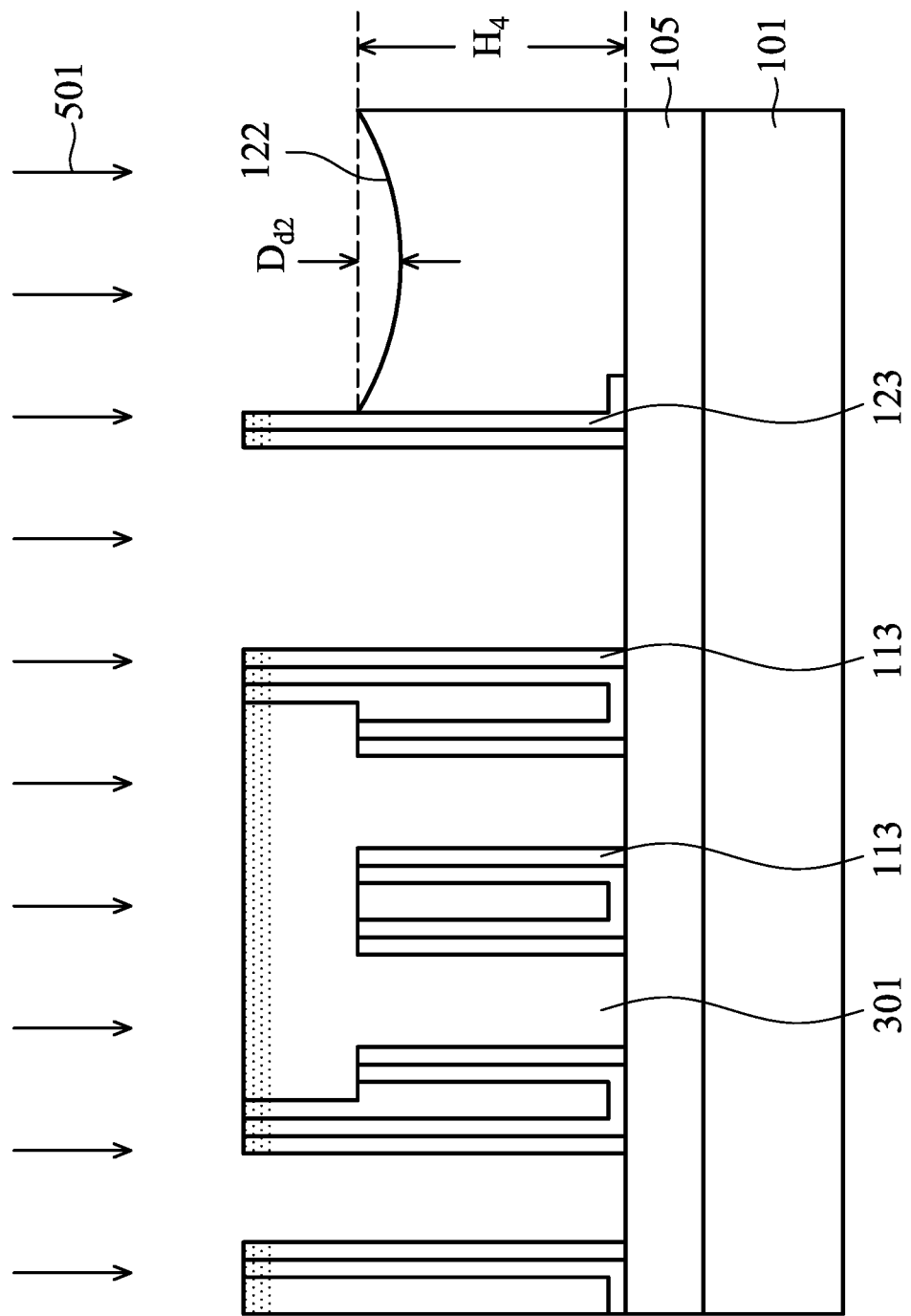
FIG. 5 illustrates a removal of gate stacks in accordance with some embodiments.

FIG. 5 illustrates that after the formation of the first implantation region 403, the dummy gate electrode 111 and the dummy gate dielectric 109 in the short channel dummy gate stack 115 and the long channel dummy gate stack 117 may be removed and replaced to form a short channel transistor 607 and a long channel transistor 609 (not illustrated in FIG. 5 but illustrated and described below with respect to FIG. 6). In an embodiment the dummy gate electrode 111 and the dummy gate dielectric 109 may be removed using, e.g., one or more wet or dry etching processes (represented in FIG. 5 by the arrows labeled 501) that utilize etchants that are selective to the material of the dummy gate electrode 111. However, any suitable removal process may be utilized.

However, as the dummy gate electrode 111 and the dummy gate dielectric 109 are being removed, material of the ILD layer 122 may also be removed, reducing the structural integrity of the ILD layer 122. But, with the presence of the first implantation region 403 at the beginning of the one or more wet or dry etching processes 501, the first implantation region 403 is more resistant to the etching process than it otherwise would be without the implantation of the first dopants.

For example, in an embodiment in which the ILD layer 122 is initially a material such as silicon dioxide and an etchant such as HF is utilized, the modification initiated by the first implantation process 401 to form the "Si—X rich" first implantation region 403 will modify the etch selectivity of the first implantation region 403 such that it is etched at a slower rate than the original silicon dioxide material of the ILD layer 122. As such, less material of the ILD layer 122 is removed during the one or more wet or dry etching processes 501 than otherwise would be possible. For example, in an embodiment the material of the ILD layer 122 may be removed such that the ILD layer 122 maintains a fourth height $H_4$ of between about 40 nm and about 50 nm, such as about 45 nm.

Additionally, with respect to the dishing of the ILD layer 122 that originally occurred during the planarization of the dielectric material 301 (see, e.g., FIG. 3A), this dishing may be mitigated during the one or more wet or dry etching processes 501. For example, as the overall height of the material of the ILD layer 122 is reduced, the original first dishing depth $D_{d1}$ will also be reduced. For example, after the one or more wet or dry etching processes 501, the material of the ILD layer 122 may have a second dishing depth $D_{d2}$ of between about 50 A and about 60 A, such as about 55 A.

Figure 6:
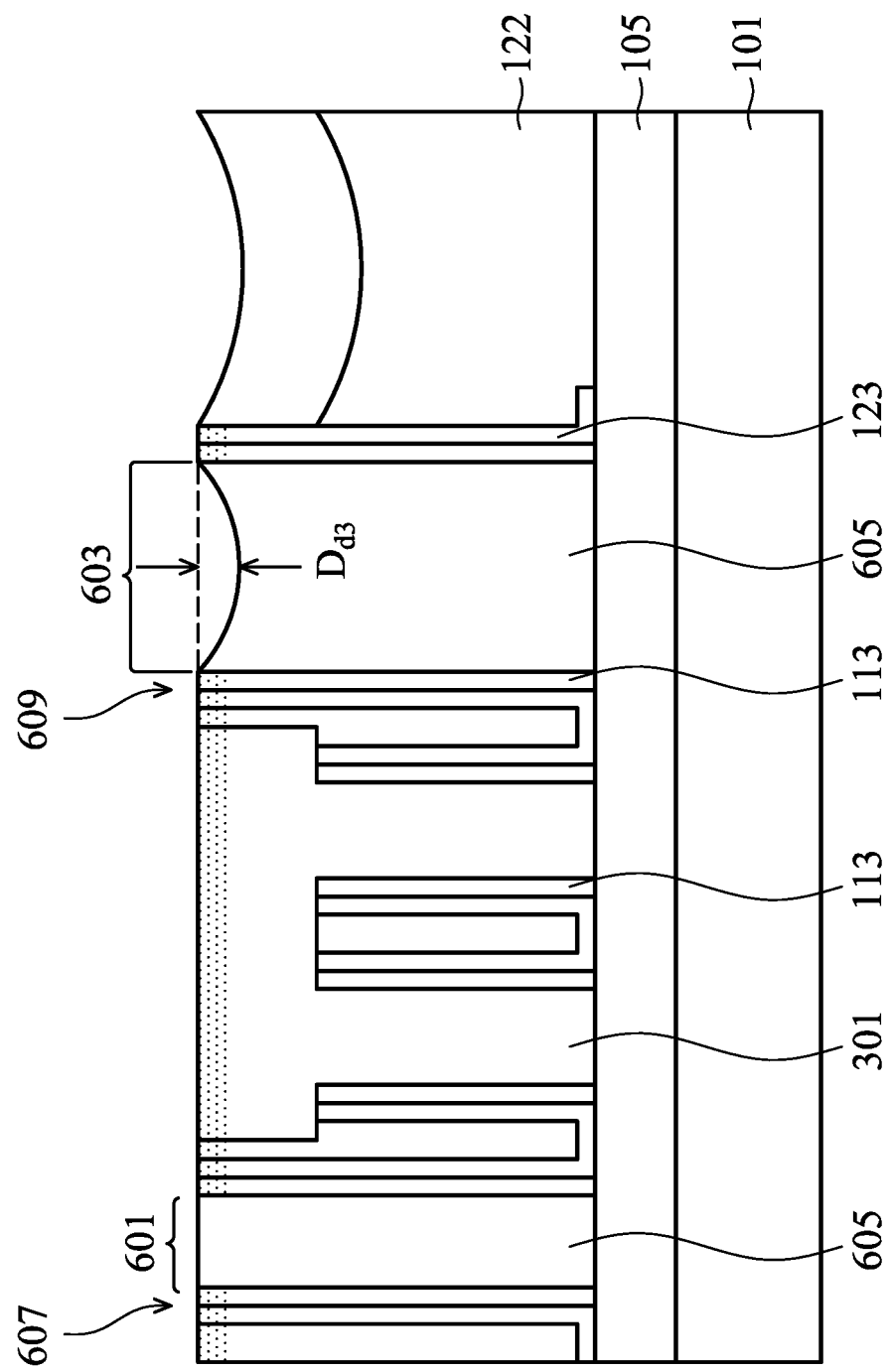
FIG. 6 illustrates a deposition of conductive material in accordance with some embodiments.

FIG. 6 illustrates that, once the dummy gate electrode 111 and the dummy gate dielectric 109 in the short channel dummy gate stack 115 and the long channel dummy gate stack 117 have been removed, the openings left behind may be refilled to form the short channel gate stack 601 and the long channel gate stack 603. In an embodiment both the short channel gate stack 601 and the long channel gate stack 603 may comprise a gate electrode 605 that will form the gate electrode for the transistors, and the gate electrode 605 may be a conductive material such as tungsten, although any suitable material may be used.

In an embodiment in which tungsten is used as the material for the gate electrode 605, the material of the gate electrode 605 may be deposited after formation of a gate dielectric using a deposition process such as CVD, PVD, ALD, combinations of these, or the like. The material of the gate electrode 605 may be deposited in order to fill and/or overfill the openings left behind by the removal of the dummy gate electrode 111 and the dummy gate dielectric 109 in the short channel dummy gate stack 115 and the long channel dummy gate stack 117. Once the material of the gate electrode 605 has been deposited to fill and overfill the openings left behind by the removal of the dummy gate electrode 111 and the dummy gate dielectric 109 in the short channel dummy gate stack 115 and the long channel dummy gate stack 117, excess material of the gate electrode 605 that is located outside of the openings may be removed using, e.g., a planarization process such as a chemical mechanical polish (CMP), although any suitable method of planarization may be utilized.

In another embodiment, the short channel gate stack 601 and the long channel gate stack 603 may be formed using a first dielectric material, a first metal material, a second metal material, and a third metal material (which materials are not separately illustrated in FIG. 6). In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode 111 and the dummy gate dielectric 109 in the short channel dummy gate stack 115 and the long channel dummy gate stack 117. In an embodiment the third metal material is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111 and the dummy gate dielectric 109 in the short channel dummy gate stack 115 and the long channel dummy gate stack 117. In a particular embodiment the third metal material may be deposited to a thickness of between about 5 Å and about 500 Å, although any suitable material, deposition process, and thickness may be utilized. Once deposited, the materials may be planarized with each other using, e.g., a chemical mechanical planarization process.

The planarization process, however, will not fully planarize each portion of the material of the gate electrode 605. Rather, the material of the gate electrode 605 in the short channel gate stack 601 may be planarized with the material of the first spacers 113, but the material of the gate electrode 605 located within the opening of the long channel gate stack 603 will see additional removal because of dishing that occurs. For example, in an embodiment the material of the gate electrode 605 in the long channel gate stack 603 may see a third dishing depth $D_{d3}$ of between about 50 A and about 60 A, such as about 55 A, although any suitable dimension may be utilized.

However, because the removal of the material of the ILD layer 122 is reduced because of the presence of the first implantation region 403, there is additional material of the ILD layer 122 present to provide additional structural support for the material of the gate electrode 605. As such, the dishing experienced by the material of the gate electrode 605 is also kept to a minimum as compared to a process which does not form the first implantation region 403.

Figure 7:
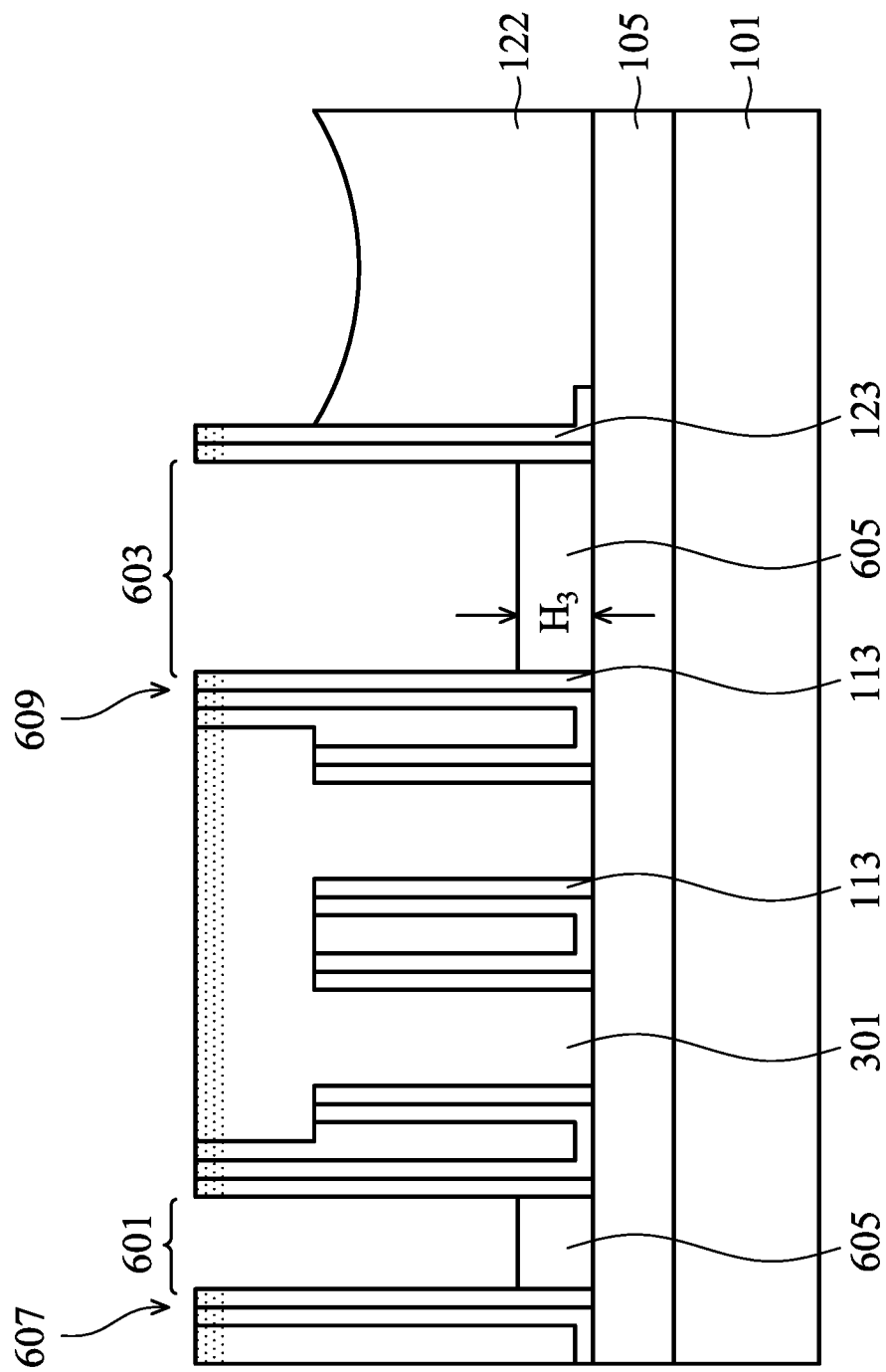
FIG. 7 illustrates a recessing of the conductive material in accordance with some embodiments.

FIG. 7 illustrates that, after the materials of the gate electrode 605 have been formed and planarized, the materials of the gate electrode 605 in the short channel dummy gate stack 115 and the long channel dummy gate stack 117 may be recessed below the surface of the ILD layer 122 in order to prepare for a placement of a capping layer 801 (not illustrated in FIG. 7 but illustrated and described below with respect to FIG. 8). In an embodiment the materials of the gate electrode 605 may be recessed using, e.g., a wet or dry etching process that utilizes etchants selective to the materials of the gate electrode 605. In an embodiment the materials of the gate electrodes 605 may be recessed such that the gate electrodes 605 have a third height $H_3$ of between about 10 nm and about 20 nm, such as about 15 nm. However, any suitable process and distance may be utilized.

However, because the dishing of the gate electrode 605 in the long channel gate stack 603 has been kept to a minimum, there is less potential that the recessing of the gate electrode 605 will expose the underlying fin 107 because of the dishing. In particular, if the dishing of the gate electrode 605 in the long channel gate stack 603 is large enough, the recessing needed to form the gate electrode 605 in the short channel gate stack 601 may also cause the gate electrode in the long channel gate stack 603 to expose and damage the underlying fin 107. However, by keeping the dishing of the gate electrode 605 to a minimum through the use of the first implantation region 403, such damage to the underlying fin may be reduced or eliminated, and the overall height of the gate stacks may be reduced without damage that would otherwise occur.

Figure 8:
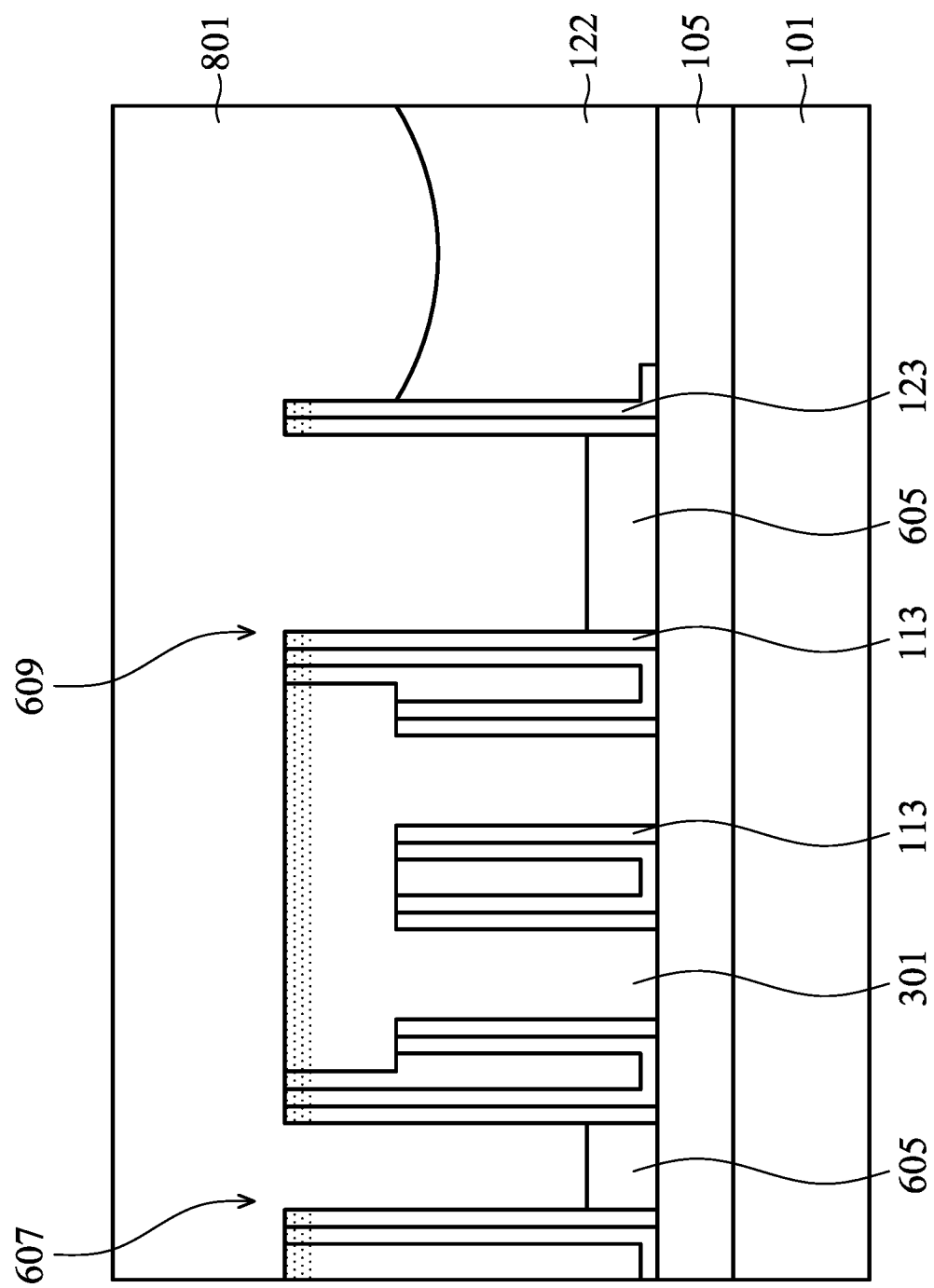
FIG. 8 illustrates a deposition of a capping material in accordance with some embodiments.

FIG. 8 illustrates that, once the materials of the gate electrode 605 have been recessed, the capping layer 801 may be deposited over the gate electrode 605. In an embodiment the capping layer 801 is a material such as SiN, SiON, SiCON, SiC, SiOC, combinations of these, or the like, deposited using a deposition process such as atomic layer deposition, chemical vapor deposition, sputtering, or the like. The capping layer 801 may be deposited to fill and/or overfill a remainder of the opening formed by the removal of the dummy gate electrode 111 from the short channel dummy gate stack 115 and the long channel dummy gate stack 117.

Figure 9:
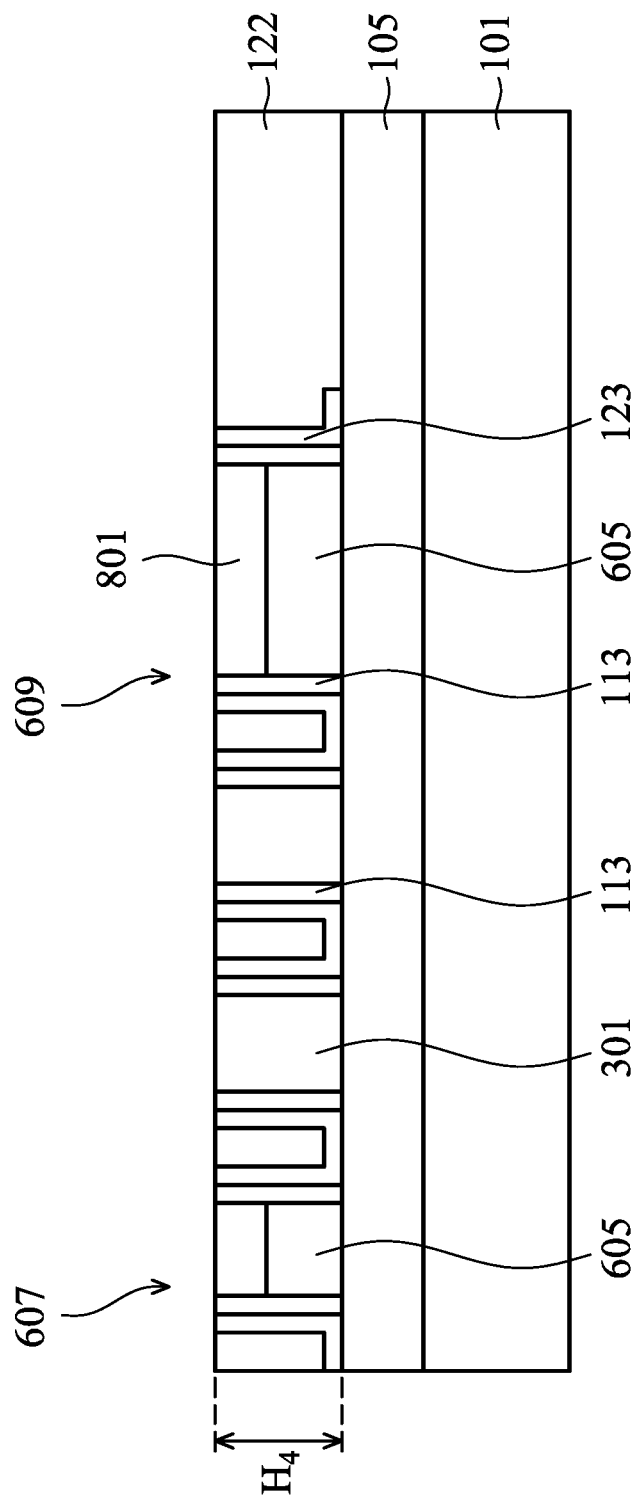
FIG. 9 illustrates a planarization of the capping material in accordance with some embodiments.

FIG. 9 illustrates that, once the material of the capping layer 801 has been formed, excess material of the capping layer 801 located outside of the opening formed by the removal of the dummy gate electrode 111 from the short channel dummy gate stack 115 and the long channel dummy gate stack 117 may be removed using, e.g., a planarization process. In an embodiment the planarization process may be a chemical mechanical polish (CMP), although any suitable planarization process, such as a grinding process or a series of one or more etches, may be utilized in order to remove the material of the capping layer 801 from outside of the openings formed by the removal of the dummy gate electrode 111 from the short channel dummy gate stack 115 and the long channel dummy gate stack 117.

Additionally, the planarization process that is used to remove excess material of the capping layer 801 may also be used to reduce the overall gate height of the devices. In an embodiment the planarization process may be used to reduce the gate height to a fourth height $H_4$ of between about 40 nm and about 50 nm, such as about 45 nm. However, any suitable gate height may be utilized.

Figure 10:
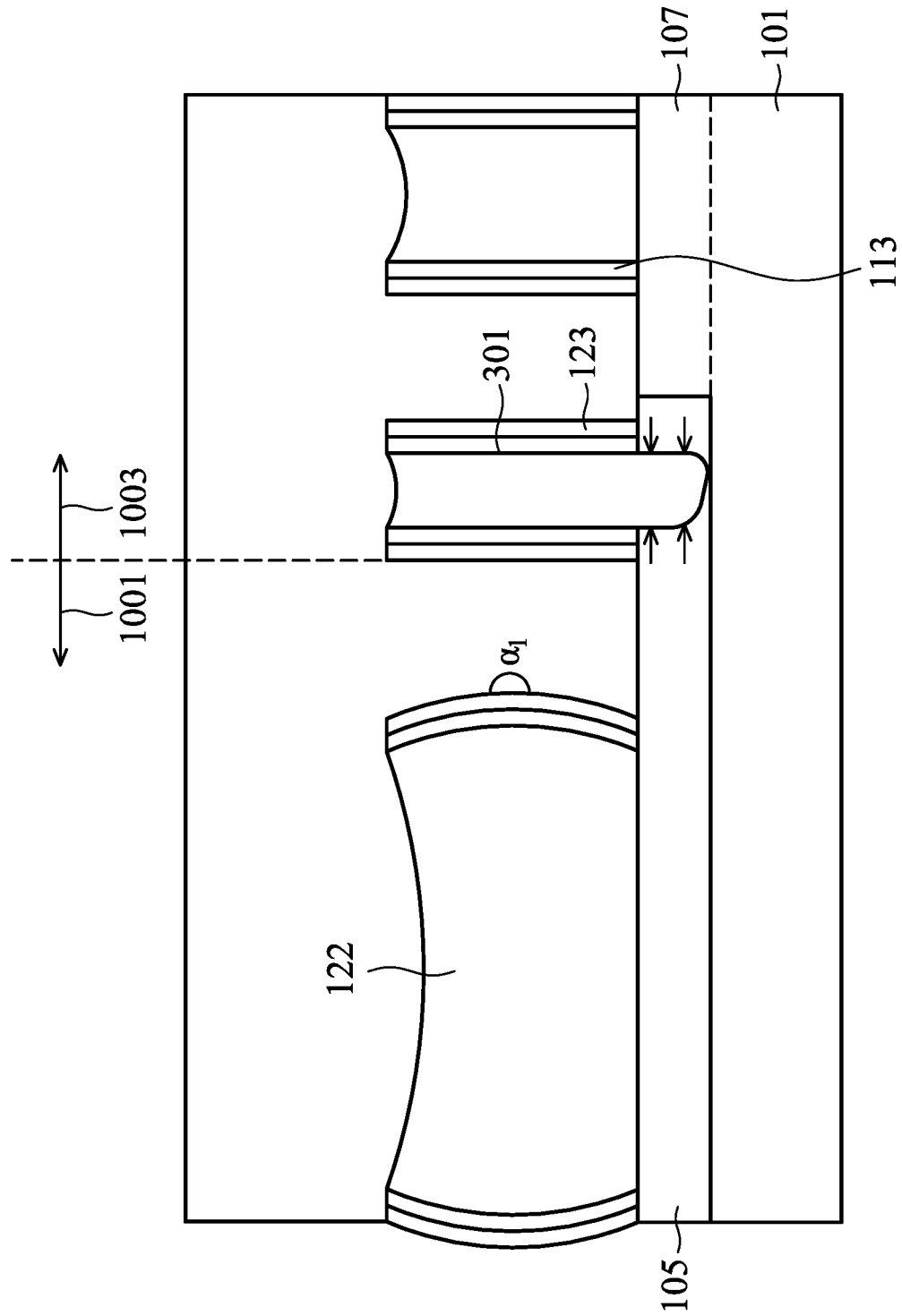
FIG. 10 illustrates the interlayer dielectric in a low device density region in accordance with some embodiments.

FIG. 10 illustrates another view of the ILD layer 122, although to a different scale for clarity. In the embodiment illustrated in FIG. 10, the ILD layer 122 is present in both a high device density region 1003 as well as a low device density region 1001. For example, in the high device density region 1003, there may be a first device density of between about 5 counts/200 nm and about 7 counts/200 nm, such as about 6 counts/200 nm, while in the low device density region 1001, there may be second device density that is less than the first device density, such as by being between about 1 count/200 nm and about 3 counts/200 nm, such as about 2 counts/200 nm. However, any suitable densities may be utilized.

In this embodiment the ILD layer 122 within the low device density region 1001 has a larger area, and the processes discussed above will result in the outside edges of certain ones of the ILD layer 122 to bend outwards. In a particular embodiment, and looking at the ILD layer 122 within the low device density region 1001 and neighboring the dielectric material 301 within the high device density region 1003, the processes described herein will generate a bend within the ILD layer 122 with a first angle $\alpha_1$ of between about 130° and about 140°, such as greater than about 135°, wherein the first angle $\alpha_1$ is measured at a distance between about 50% and about 70% of the height of the ILD layer 122 measured from the bottom of the ILD layer 122.

Additionally, FIG. 10 also illustrates that, in some embodiments, the removal of the dummy gate electrode 111 from the dummy stacks 116 may etch into the first isolation regions 105. Once the dielectric material 301 is deposited into the openings, an extension of the dielectric material 301 extends into the first isolation region 105. However, given the processes discussed herein, the extension will have a fairly consistent width as it extends into the first isolation region 105. For example, in an embodiment the extension may have a fifth width $W_5$ at a distance of 10% of the depth of the extension and a sixth width $W_6$ at a distance of 90% of the depth of the extension, wherein the sixth width $W_6$ is between about 80% to about 100% of the fifth width $W_5$.

In accordance with an embodiment, a method of manufacturing a semiconductor device comprising depositing a first dummy gate stack and a second dummy gate stack, wherein the first dummy gate stack has a first channel length and the second dummy gate stack has a second channel length different from the first channel length is provided. An interlayer dielectric is deposited around the first dummy gate stack and the second dummy gate stack, and the first dummy gate stack, the second dummy gate stack and the interlayer dielectric are planarized. Ions are implanted into the interlayer dielectric to form an implanted region, and the first dummy gate stack and the second dummy gate stack are removed to form a first opening and a second opening, wherein the removing the first dummy gate stack and the second dummy gate stack reduces a height of the interlayer dielectric. The first opening and the second opening are filled with a conductive material.

In accordance with another embodiment, a method of manufacturing a semiconductor device comprising forming first spacers adjacent to a short channel dummy gate, forming second spacers adjacent to a long channel dummy gate, and forming third spacers adjacent to a first dummy gate is provided. A first dielectric material is deposited adjacent to both the first spacers and the second spacers, and the first dummy gate is removed to form a first opening without removing the short channel dummy gate and without removing the long channel dummy gate. The first opening is filled with a second dielectric material and the second dielectric material is planarized, wherein the planarizing the second dielectric material exposes the short channel dummy gate and the long channel dummy gate. Ions are implanted into the first dielectric material, the short channel dummy gate, the long channel dummy gate, the first spacers, and the second spacers. The short channel dummy gate and the long channel dummy gate are removed to form second openings, the second openings are filled with a conductive material, and the conductive material is etched back.

In accordance with yet another embodiment, a method of manufacturing a semiconductor device comprising forming a plurality of dummy gate stacks, wherein a first one of the plurality of dummy gate stacks has a length larger than a remainder of the plurality of dummy gate stacks is provided. An interlayer dielectric is deposited around the plurality of dummy gate stacks and one of the plurality of dummy gate stacks is replaced with a dielectric material without replacing the first one of the plurality of dummy gate stacks. The dielectric material is planarized with the interlayer dielectric and the first one of the plurality of dummy gate stacks. A concentration of components is modified in an implantation region along a top surface of the interlayer dielectric and the plurality of dummy gate stacks. The first one of the plurality of dummy gate stacks is removed to form a first opening, wherein the removing the first one of the plurality of dummy gate stacks further reduces a height of the interlayer dielectric, and the first opening is filled with a gate electrode material. The gate electrode material is recessed within the first opening to form a gate electrode, and a remainder of the first opening is filled with a capping material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a first dummy gate stack and a second dummy gate stack, wherein the first dummy gate stack has a first channel length and the second dummy gate stack has a second channel length different from the first channel length;
    depositing an interlayer dielectric around the first dummy gate stack and the second dummy gate stack;
    planarizing the first dummy gate stack, the second dummy gate stack and the interlayer dielectric;
    after planarizing the first dummy gate stack, implanting ions into the interlayer dielectric to form an implanted region;
    after implanting ions into the interlayer dielectric, removing the first dummy gate stack and the second dummy gate stack to form a first opening and a second opening, wherein the removing the first dummy gate stack and the second dummy gate stack reduces a height of the interlayer dielectric; and
    filling the first opening and the second opening with a conductive material.

2. The method of claim 1, further comprising recessing the conductive material within the first opening.

3. The method of claim 2, further comprising filling a remainder of the first opening with a capping material.

4. The method of claim 3, further comprising planarizing the capping material and the interlayer dielectric.

5. The method of claim 1, wherein the implanting the ions generate tetra-dentate ligands in the interlayer dielectric.

6. The method of claim 1, wherein the interlayer dielectric has a sidewall with a bending angle of greater than about 135°.

7. The method of claim 1, wherein the second channel length is at least 10 nm.

8. A method of manufacturing a semiconductor device, the method comprising:
    forming first spacers adjacent to a short channel dummy gate, forming second spacers adjacent to a long channel dummy gate, and forming third spacers adjacent to a first dummy gate;
    depositing a first dielectric material adjacent to both the first spacers and the second spacers;
    removing the first dummy gate to form a first opening without removing the short channel dummy gate and without removing the long channel dummy gate;
    filling the first opening with a second dielectric material;
    planarizing the second dielectric material, wherein the planarizing the second dielectric material exposes the short channel dummy gate and the long channel dummy gate;
    implanting ions into the first dielectric material, the short channel dummy gate, the long channel dummy gate, the first spacers, and the second spacers;
    removing the short channel dummy gate and the long channel dummy gate to form second openings;
    filling the second openings with a conductive material; and
    etching back the conductive material.

9. The method of claim 8, wherein the ions are a Group IV element.

10. The method of claim 9, wherein a concentration of the ions after the implanting the ions is between about $1.0 \times 10^{16}$ atoms/cm$^2$ and about $2.0 \times 10^{16}$ atoms/cm$^2$.

11. The method of claim 8, wherein the long channel dummy gate has a length of greater than about 10 nm.

12. The method of claim 11, wherein the short channel dummy gate has a length of less than about 10 nm.

13. The method of claim 8, further comprising depositing a capping layer over the conductive material after the etching back the conductive material.

14. The method of claim 13, further comprising planarizing the capping layer with the first dielectric material.

15. A method of manufacturing a semiconductor device, the method comprising:
    forming a plurality of dummy gate stacks, wherein a first one of the plurality of dummy gate stacks has a length larger than a remainder of the plurality of dummy gate stacks;
    depositing an interlayer dielectric around the plurality of dummy gate stacks;
    replacing one of the plurality of dummy gate stacks with a dielectric material without replacing the first one of the plurality of dummy gate stacks;
    planarizing the dielectric material with the interlayer dielectric and the first one of the plurality of dummy gate stacks;
    modifying a concentration of components in an implantation region along a top surface of the interlayer dielectric and the plurality of dummy gate stacks;
    removing the first one of the plurality of dummy gate stacks to form a first opening, wherein the removing the first one of the plurality of dummy gate stacks further reduces a height of the interlayer dielectric;
    filling the first opening with a gate electrode material;
    recessing the gate electrode material within the first opening to form a gate electrode; and filling a remainder of the first opening with a capping material.

16. The method of claim 15, further comprising planarizing the capping material with the interlayer dielectric, wherein the planarizing the capping material with the interlayer dielectric reduces the height of the interlayer dielectric to less than about 50 nm.

17. The method of claim 15, wherein the modifying the concentration of components increases a concentration of Group IV elements.

18. The method of claim 15, wherein the replacing the one of the plurality of dummy gate stacks further reduces a height of a first spacer adjacent to the one of the plurality of dummy gate stacks.

19. The method of claim 18, wherein the replacing the one of the plurality of dummy gate stacks does not reduce a height of a second spacer adjacent to the first spacer.

20. The method of claim 15, wherein after the planarizing the dielectric material with the interlayer dielectric, the interlayer dielectric has a first dishing depth, and wherein after the removing the first one of the plurality of dummy gate stacks the interlayer dielectric has a second dishing depth less than the first dishing depth.

\* \* \* \* \*